US012803562B2

(12) United States Patent
Yi

(10) Patent No.: US 12,803,562 B2
(45) Date of Patent: Nov. 17, 2026

(54) WIRELESS DEVICE CLOCK SYNCHRONIZATION

(71) Applicant: Synaptics Incorporated, San Jose, CA (US)

(72) Inventor: John Seungtae Yi, San Diego, CA (US)

(73) Assignee: Synaptics Incorporated, San Jose, CA (US)

( * ) Notice: Subject to any disclaimer, the term of this patent is extended or adjusted under 35 U.S.C. 154(b) by 27 days.

(21) Appl. No.: 18/702,502

(22) PCT Filed: Oct. 28, 2022

(86) PCT No.: PCT/US2022/048186
§ 371 (c)(1),
(2) Date: Apr. 18, 2024

(87) PCT Pub. No.: WO2023/076571
PCT Pub. Date: May 4, 2023

(65) Prior Publication Data

US 2025/0260407 A1 Aug. 14, 2025

Related U.S. Application Data

(60) Provisional application No. 63/273,734, filed on Oct. 29, 2021.

(51) Int. Cl.
*H03L 7/099* (2006.01)
*H04B 1/06* (2006.01)

(52) U.S. Cl.
CPC ............. *H03L 7/0991* (2013.01); *H04B 1/06* (2013.01)

(58) Field of Classification Search
CPC ................................ H03L 7/0991; H04B 1/06
(Continued)

(56) References Cited

U.S. PATENT DOCUMENTS 8,873,606 B2 * 10/2014 Zhang .................... H03D 3/006 375/295
10,389,486 B1 * 8/2019 Li ..................... H04L 25/03299
(Continued)

FOREIGN PATENT DOCUMENTS

EP 3644661 A1 4/2020
WO 2023076571 A2 5/2023

OTHER PUBLICATIONS

International Search Report for International Application PCT/US22/48186; Dated May 2, 2023, 4 pages.
(Continued)

*Primary Examiner* — Kevin M Burd
(74) *Attorney, Agent, or Firm* — Paradice & Li LLP

(57) ABSTRACT

A wireless receiver for receiving and outputting media content received from a wireless transmitter is provided. The wireless receiver may include a receiver circuit, a media content processing circuit, and a media content output circuit to output the prepared digital media data with a defined timing. The wireless receiver may further include a first clock signal generator configured to generate first timing signals for the media content processing circuit and the media content output circuit. The wireless receiver may further include a clock compensation circuit configured to receive a timing reference from a source device, receive and adjust a phase and/or a frequency of the first timing signals, and output adjusted first timing signals. The wireless receiver may further include a second clock signal generator configured to receive the adjusted first timing signals and to output second timing signals for clocking the media content output circuit.

20 Claims, 10 Drawing Sheets

(58) Field of Classification Search
USPC .......................................................... 375/376
See application file for complete search history.

(56) References Cited

U.S. PATENT DOCUMENTS

| | | | | |
|---|---|---|---|---|
| 10,615,955 | B2 | 4/2020 | Oh et al. | |
| 2007/0190964 | A1* | 8/2007 | Edwards ............ | H04W 52/029<br>455/343.1 |
| 2011/0075778 | A1 | 3/2011 | Chang | |
| 2011/0099408 | A1 | 4/2011 | Yin et al. | |

OTHER PUBLICATIONS

Written Opinion of the International Searching Authority for International Application PCT/US22/48186; Dated May 2, 2023, 4 pages.
Extended European Search Report dated Jun. 10, 2025 from EP Application No. 22888230.4-12-18.
Partial European Search Report dated May 6, 2025 from EP Application No. 22888230.4-12-18.

* cited by examiner

WIRELESS DEVICE CLOCK SYNCHRONIZATION

TECHNICAL FIELD

The present disclosure generally relates to clock signal generation in wireless transmission and content delivery systems.

BACKGROUND

Wireless communication enabled devices are in widespread use, with media content delivery being one commonly implemented wireless system. A wireless enabled device may include a source device, and one or more accessory devices. Each device has a respective wireless communication circuit with an antenna. The source device includes a microphone and the accessory devices include audio speakers with which the accessory generates analog signal outputs for a user. In wireless systems with multiple devices, timing synchronization can be important. A Bluetooth Low Energy (LE) audio system, for example, contains multiple clocks among all the devices in a network. Each device may contain a separate clock signal for the audio and wireless subsystems. For example, a source device audio subsystem clock ($C_{AS}$), and a source device wireless subsystem clock ($C_{WS}$) may be included. The accessory devices may be constructed similarly.

Each clock can drift over time due to inaccuracies of $C_{AS}$ and $C_{WS}$. For example, if $C_{AS}$ and $C_{WS}$ each have an inaccuracy of 20 parts per million (ppm), the worst-case drift between both the clocks is 40-μs after 1 second. Using 7.5-ms frame durations, this results in a possible audio frame overrun or underrun every 3.2 minutes. Drift can also occur between $C_{AS}$ and $C_{WS}$ even if they originate from the same oscillator. For example, the audio subsystem may use a clock rate that is a non-integer multiple of the wireless subsystem clock, and the fractional part of the clock divide results in clock drift. Moreover, clocks are also sensitive to ambient temperature and, accordingly, may change accuracy overtime. Accordingly, drift may vary over long periods of time as well.

SUMMARY

In embodiments of the invention, a wireless receiver for receiving and outputting media content received from a wireless transmitter is provided. The wireless receiver includes a wireless receiver circuit including an antenna configured to receive digital media content wirelessly from a source transmitter of a source device. The wireless receiver further includes a media content processing circuit configured to receive digital media data from the wireless receiver circuit and prepare the received digital media data for output. The wireless receiver includes a media content output circuit configured to receive the prepared digital media data and to output the prepared digital media data with a defined timing. The wireless receiver includes an oscillator. The wireless receiver includes a first clock signal generator coupled to an output of the oscillator, and the first clock signal generator is configured to generate first timing signals for the media content processing circuit and the media content output circuit. The wireless receiver includes a clock compensation circuit coupled to the first clock signal generator. The clock compensation circuit is configured to: (i) receive a timing reference from the source transmitter of the source device, (ii) receive the first timing signals from the first clock signal generator, (iii) adjust a phase and/or adjust a frequency of the first timing signals, and (iv) output adjusted first timing signals. The wireless receiver includes a second clock signal generator configured to receive the adjusted first timing signals from the clock compensation circuit and to output second timing signals for clocking the media content output circuit. In some embodiments, the clock compensation circuit is configured to compare the second timing signals to a timing reference received from the source transmitter of the source device.

These and other embodiments can each optionally include one or more of the following features.

In some embodiments of the invention, the media content output circuit includes a digital to analog converter coupled to an output transducer.

In some embodiments of the invention, the output transducer includes a speaker, and the digital media content includes digitally encoded audio.

In some embodiments of the invention, the second clock signal generator and the media content output circuit are on a different integrated circuit from the first clock signal generator.

In some embodiments of the invention, the clock compensation circuit is configured to receive a first timing reference signal from the wireless receiver circuit. In some embodiments of the invention, the clock compensation circuit is configured to receive a second timing reference signal from the media content output circuit. In some embodiments of the invention, the clock compensation circuit includes a feedback loop that compares the first timing reference signal from the wireless receiver circuit to the second timing reference signal from the media content output circuit. In some embodiments of the invention, the clock compensation circuit includes at least one of a drift compensation circuit or a phase compensation circuit.

In some embodiments of the invention, the wireless receiver device is a first wireless receiver device of a plurality of wireless receiver devices, and each wireless receiver device of the plurality of wireless receiver devices is coupled to the source transmitter of the source device and configured to receive the timing reference from the source device. In some embodiments of the invention, each wireless receiver device of the plurality of wireless receiver devices are configured to determine an offset based on detecting a time difference between the timing reference from the source device and a timing signal from a corresponding clock signal generator at each wireless receiver device and adjust the timing signal from the corresponding clock signal generator to a predetermined value based on the offset.

In some embodiments of the invention, a method of synchronizing output timing between two or more independent wireless receivers is provided. The method may include, at a first wireless receiver device including a processor, receiving a first timing signal from a wireless communication subsystem of the first wireless receiver device. The method may include receiving a second timing signal from an output subsystem of a second wireless receiver device that is different than the first wireless receiver device. The method may include comparing the first timing signal and the second timing signal to determine whether there is a clock drift between the first timing signal and the second timing signal. The method may include, in response to determining that there is a clock drift between the first timing signal and the second timing signal, adjusting at least one of: (i) a first clock signal associated with the wireless communication subsystem of the first wireless receiver device, or (ii) a second clock signal associated with the output subsystem of the second wireless receiver device.

This summary is provided to introduce a selection of concepts in a simplified form that are further described below in the detailed description. This summary is not intended to identify key features or essential features of the claimed subject matter, nor is it intended to be used in isolation as an aid in determining the scope of the claimed subject matter.

BRIEF DESCRIPTION OF THE DRAWINGS

A more complete appreciation of the subject matter of the present disclosure and of the various advantages thereof can be realized by reference to the following detailed description in which reference is made to the accompanying drawings.

DETAILED DESCRIPTION

Figure 1A:
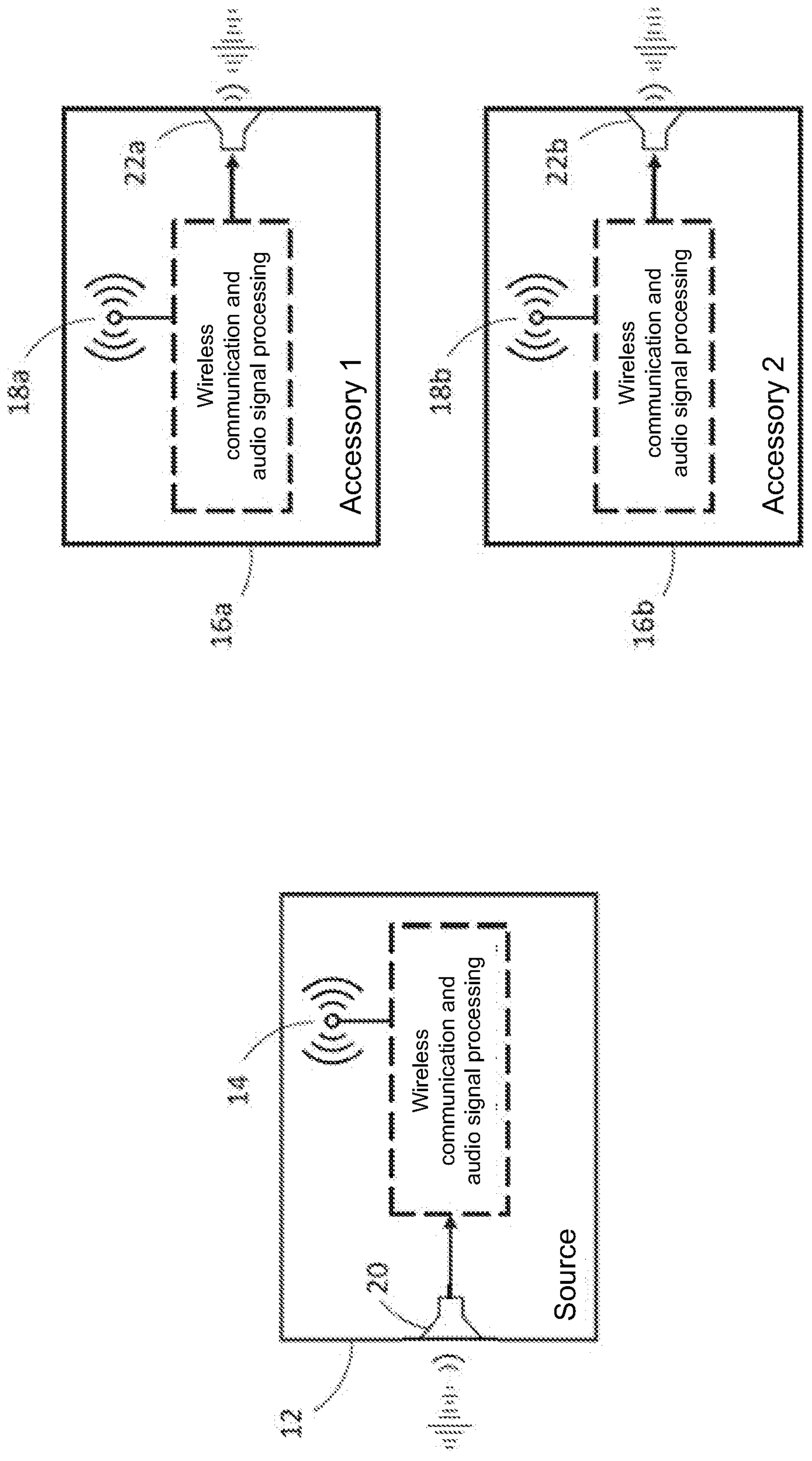
FIGS. 1A and 1B illustrate a Bluetooth low energy audio system having multiple clocks, in accordance with some example embodiments.
Figure 1B:
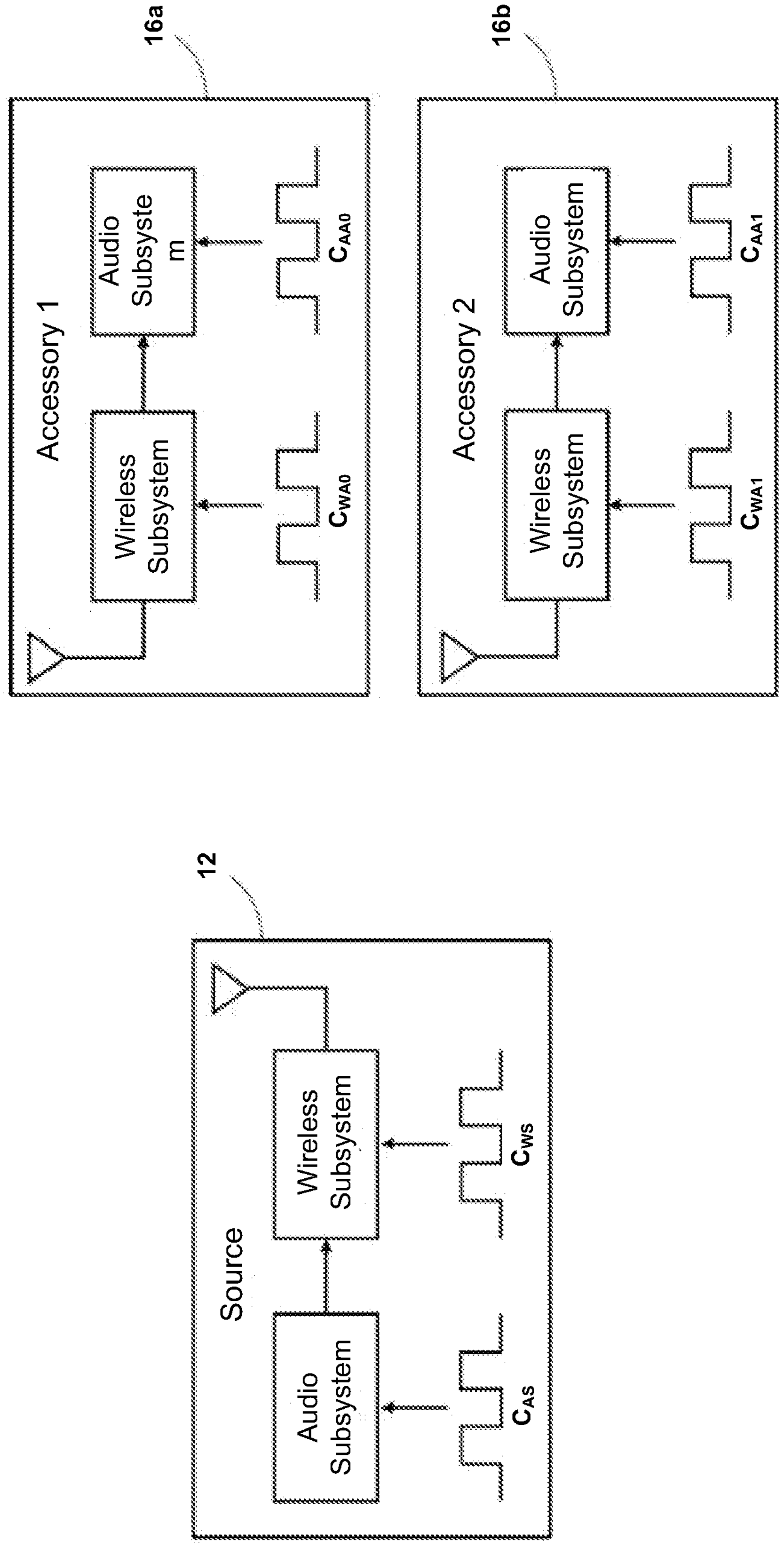

Wireless communication enabled devices are in widespread use, with media content delivery being one commonly implemented wireless system. As shown in FIG. 1A, a wireless enabled device may include a source device 12, and one or more accessory devices 16*a* and 16*b*. Each device has a respective wireless communication circuit with an antenna 14, 18*a*, 18*b*. In the example of FIG. 1A, the source device includes a microphone 20 and the accessory devices 16*a*, 16*b* include audio speakers 20*a* and 20*b* with which the accessory generates analog signal outputs. In wireless systems with multiple devices, timing synchronization can be important. A Bluetooth LE audio system, for example, contains multiple clocks among all the devices in a network such as illustrated in FIG. 1B. Each device may contain a separate clock signal for the audio and wireless subsystems. For example, $C_{AS}$ is illustrated as a source device 12 audio subsystem clock, and $C_{WS}$ is illustrated as a source device wireless subsystem clock. The accessory devices 16*a*, 16*b* may be constructed similarly.

Each clock can drift over time due to inaccuracies of $C_{AS}$ and $C_{WS}$. For example, if $C_{AS}$ and $C_{WS}$ each have an inaccuracy of 20 parts per million (ppm), the worst-case drift between both the clocks is 40-μs after 1 second. Using 7.5-ms frame durations, this results in a possible audio frame overrun or underrun every 3.2 minutes. Drift can also occur between $C_{AS}$ and $C_{WS}$ even if they originate from the same oscillator. For example, the audio subsystem may use a clock rate that is a non-integer multiple of the wireless subsystem clock, and the fractional part of the clock divide results in clock drift.

Clocks are also sensitive to ambient temperature and, accordingly, may change accuracy overtime. Accordingly, drift may vary over long periods of time as well.

The synchronization methods and apparatus described herein may in some embodiments be advantageously applied in a Bluetooth Low Energy (BLE) protocol environment. A discussion of one or more challenges related to BLE synchronization of audio and wireless clocks follows, with particular attention to clocking the output of the audio subsystems of the accessories. Clocks between wireless systems may also drift. However, the Bluetooth LE specification defines how wireless systems synchronize clocks.

Asynchronous Audio Output—In the case of TWS (True Wireless Stereo) systems, the left and right accessory devices should present corresponding audio to the user at the same time. With Bluetooth LE there is no defined means for independent accessory (e.g., left earbud and right earbud) devices to communicate with each other to coordinate output to the user. For example, using Bluetooth LE audio, the left and right audio frames may be transmitted at different time slots by the source audio device. Consequently, each accessory device receives audio frames at different times. Rendering audio immediately after receiving an audio frame will result in TWS audio systems rendering un-synchronized audio.

Figure 2A:
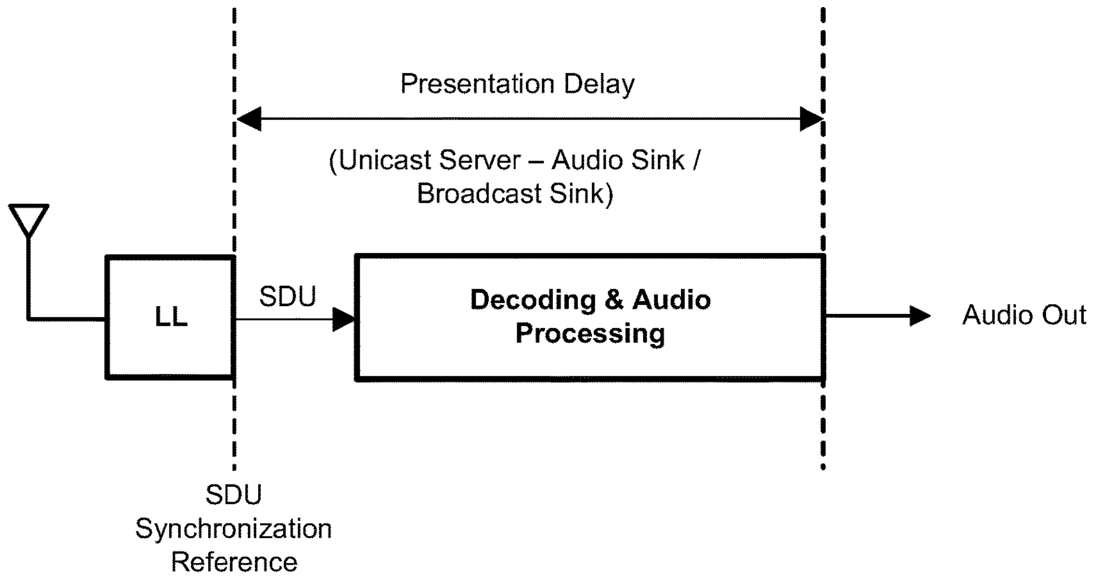
FIGS. 2A and 2B illustrate Presentation Delay and Output Path Delay.
Figure 2B:
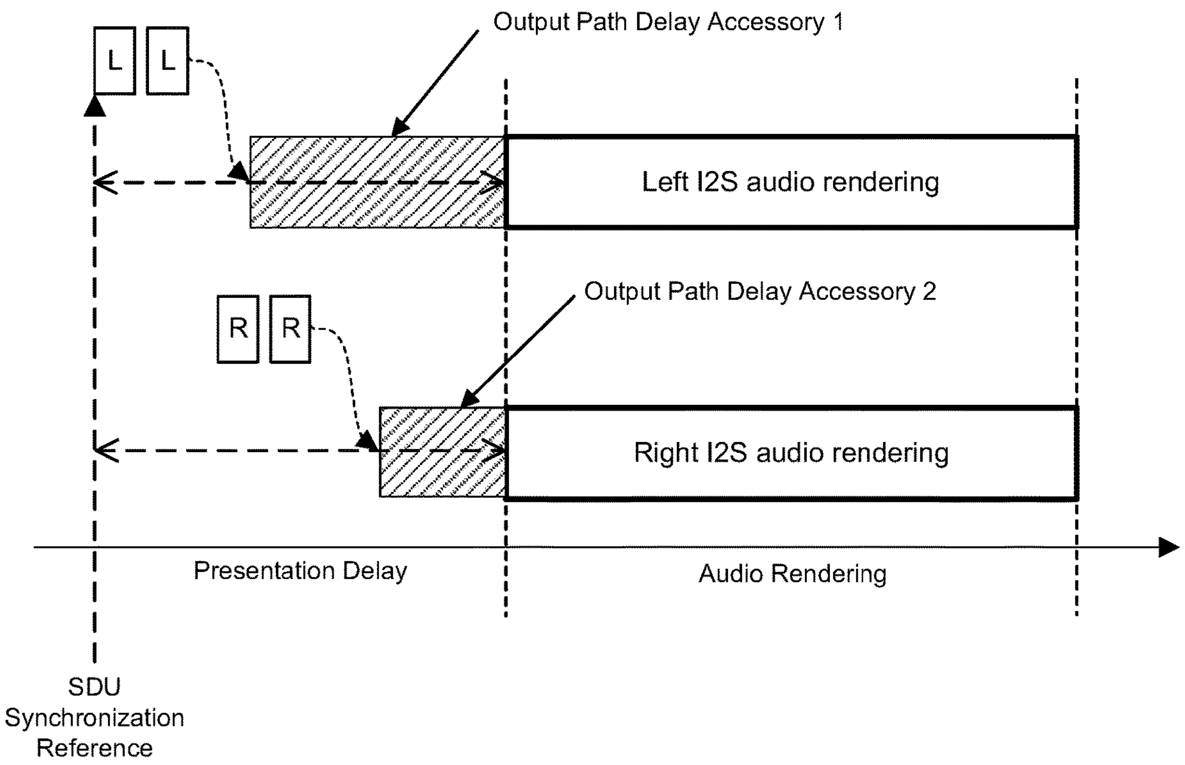

Output Delay—The Bluetooth LE protocol requires the rendered output to be presented at a specific time. For example, FIGS. 2A and 2B describe a parameter called Presentation_Delay which is the amount of time from the synchronization distribution unit (SDU) Synchronization Reference to the time when audio exits the transducer. An audio receiver device must delay rendering output until the specified time. Any system delays due packet handling, decoding, I/O transfer, ADC group delay, etc. must be accounted for in the amount of buffering time. These system delays are summed together and collectively referred to as Output Path Delay. The Output Path Delay is different for each accessory device as well as for each packet received, for example, as illustrated in FIG. 2B.

Adjustment Precision—The desired precision for spatial audio is less than a single audio sample. In the case of 48-kHz sampling rate for high quality audio, that is 20.8-μs. Accordingly, a high precision delay adjustment mechanism should be provided to achieve left and right synchronization.

Packet Loss Timing Estimation—Bluetooth LE accessory devices may lose packets. The ISO feature allows for retransmission and reduces the probability of packet loss. However, packet loss is still possible. In the event an accessory device loses packets, it also fails to obtain a timing reference by the source device. The loss of timing reference must be accounted for by the receiving device to maintain audio synchronization.

Figure 3:
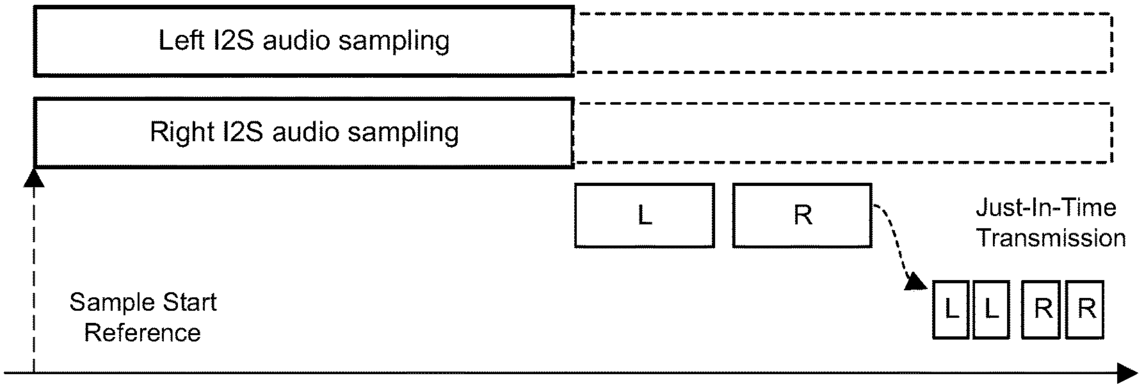
FIG. 3 illustrates a just-in-time transmission, in accordance with some example embodiments.

Low Latency Input—To achieve low latency on the input audio data path, audio packets must be encoded JIT (ust-in-time). JIT transmission must allow for audio sampling and the encoding of all audio frames. An example is depicted in FIG. 3, which shows the timeline of operations prior to a JIT Transmission for a TWS system. This example uses a single CPU core to encode both left and right audio channels. The single CPU core encodes each frame in series. Left and right audio sampling is continuous. Accessory devices experiencing right channel audio delayed could be due the following reasons. First, the encoder may use a different Sample Start Reference for each of the audio frames. Second, left and right audio frames are sent on different ISO events.

Common Time-base for Multiple CPU Systems—The wireless subsystem provides received packet timestamps in absolute time. The presentation delay is computed using the wireless subsystem timestamp as a start reference. In some multiprocessor implementations, the wireless subsystem executes on one processor core and the presentation compensation algorithm executes on a different processor core. A common absolute time clock reference is needed for the processor responsible for computing the actual presentation delay.

Board Dependent Calibration—Calibration for board dependent delay may be needed for audio applications which require high audio synchronization precision. Manufacturing process can measure this board dependent delay which can be used by the presentation compensation algorithm.

Figure 4:
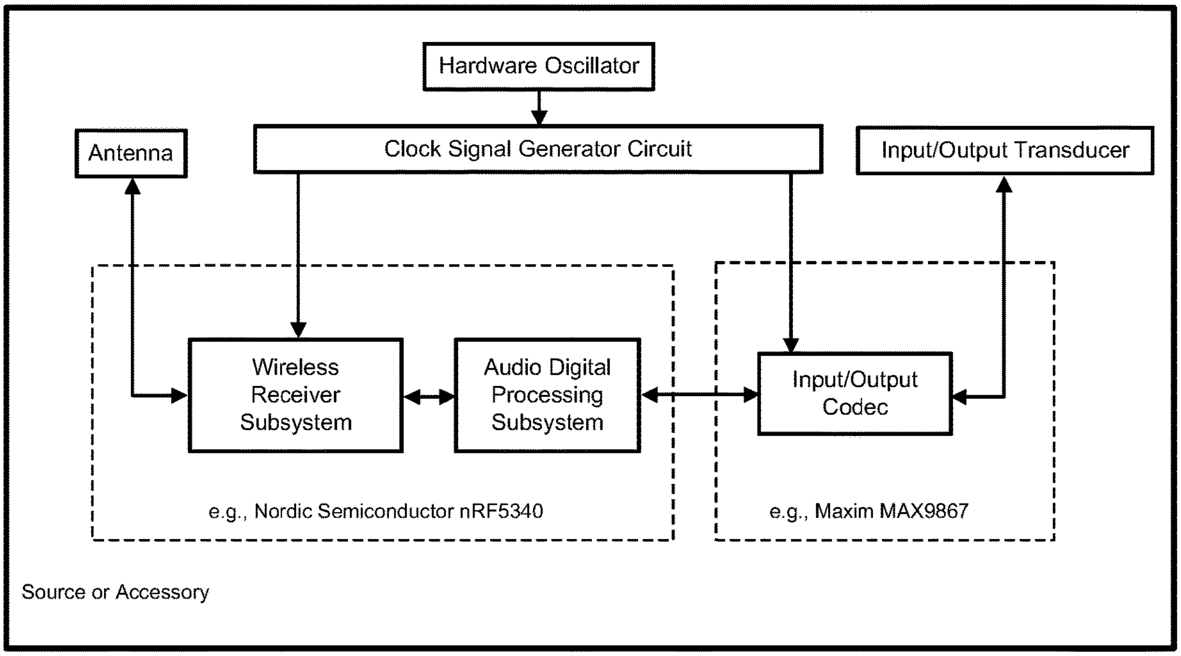
FIG. 4 is a block diagram of a source and/or accessory device.

Several example embodiments directed to improving BLE synchronization of audio and wireless clocks having one or more inventive features will now be described. Improved audio synchronization between accessory devices may be achieved using the following features: drift compensation, presentation compensation, audio first in, first out (FIFO), and/or audio input processor. As described below, some embodiments of the inventions have been successfully implemented in a Bluetooth Low Energy protocol environment using the Nordic Semiconductor nRF5340 SOC and the Maxim MAX9867 audio codec. One example block diagram of such a configuration is provided in FIG. 4. It will be appreciated that the inventions described herein can be implemented on a wide variety of platforms, processors, codecs, etc. and are applicable to a variety of system input and output types, not just audio.

Drift Compensation

Figure 5:
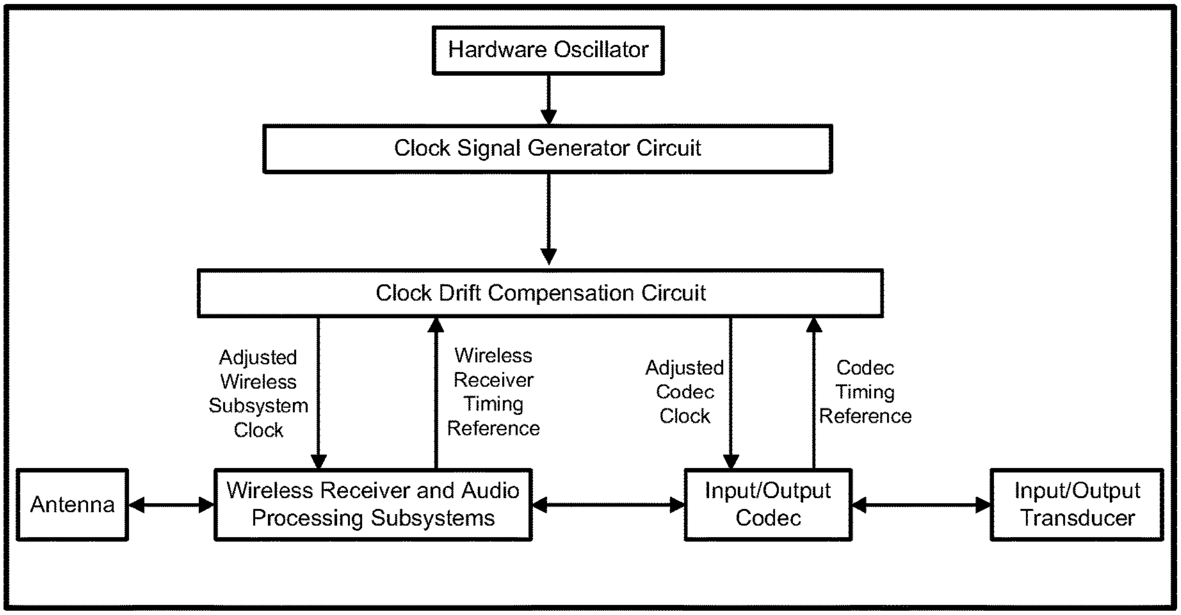
FIG. 5 is a block diagram of an accessory device having a drift compensation system, in accordance with some example embodiments.
Figure 6:
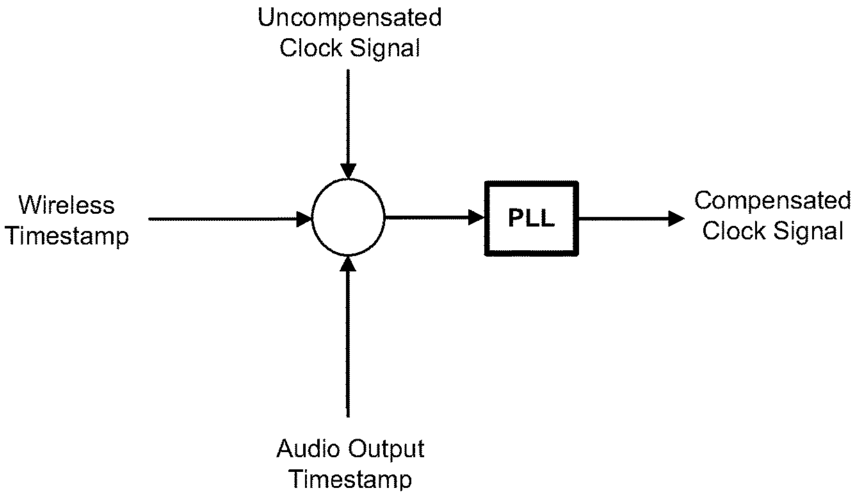
FIG. 6 is a block diagram of a drift compensation feedback loop, in accordance with some example embodiments.

Drift Compensation is a closed loop control system for synchronizing the audio clock with the wireless clock on an accessory device. Since the wireless clocks between the source and accessory devices are already synchronized, the accessory device can use the wireless clock to synchronize its audio clock with the source device. FIG. 5 is a block diagram of an accessory incorporating clock drift compensation in accordance with some embodiments. FIG. 6 is a block diagram of a drift compensation feedback loop that may be used in the example accessory shown in FIG. 5.

Figure 7A:
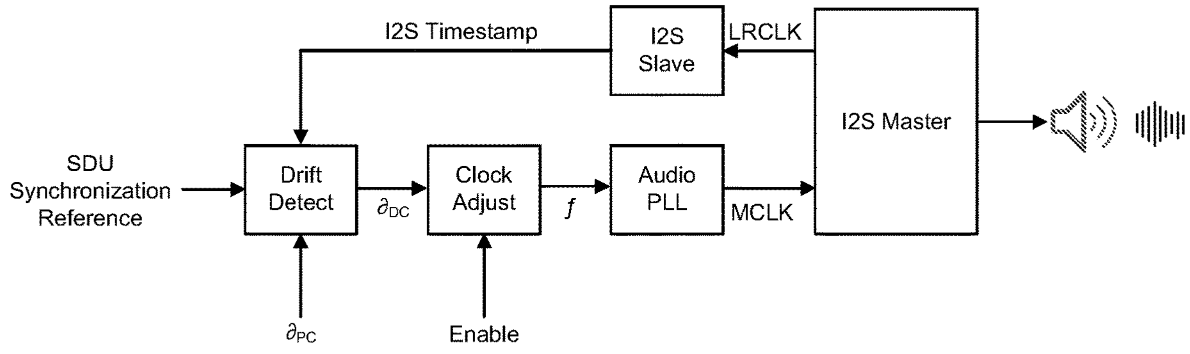
FIG. 7A is a block diagram of an implementation of the feedback loop of FIG. 6.

FIG. 7A is a specific implementation of a drift compensation feedback loop. In this implementation, an Audio Phase-Locked Loop (PLL) (e.g., nRF5340) is used to adjust the master clock (MCLK) to an external audio codec (e.g., MAX9867). The external audio codec, in turn, uses the MCLK reference to return the I2S audio timing signals. These I2S audio timing signals are synchronized with the clock of the source device.

In this implementation, circuit computes a delta time (DC) which is the sum of drift between the wireless and audio subsystems. The accessory device wireless system will appear to drift with respect to the local clock. The external audio codec will also drift with respect to the local clock. The Drift Detect block will account for both drift errors.

The Drift Detect block processes every audio frame received or expected reception (i.e., lost frame). The wireless subsystem delivers the audio subsystem a single audio frame at a time with a timestamp. This timestamp is the SDU Synchronization Reference for the received audio frame. If an audio frame is lost, the wireless subsystem will send an estimated SDU Synchronization Reference for use by the Drift Detect block.

The Drift Detect block measures the drift by computing the amount of error between the wireless and audio clocks using the local clock as a reference (e.g., left-right clock (LRCLK)). The wireless subsystem error is measured using the SDU Synchronization Reference. The audio subsystem error is measured by examining the I2S timestamp of the codec, e.g., FRAMESTART.

The Clock Adjust block computes the new clock frequency for the Audio PLL. The Audio PLL is adjusted such that the speed of the output clock signal to the codec (e.g., MCLK) drifts at the same rate as the audio packets are received from the wireless. The Enable input allows the Audio PLL adjustment to be enabled or disabled. Disabling allows the complete Drift Compensation algorithm to execute but does not apply the compensated value.

In this embodiment, Drift Compensation behavior is driven by a state machine. This state machine is called regularly to compute error and set the compensated Audio PLL frequency. See, for example, FIG. 7B.

Figure 7B:
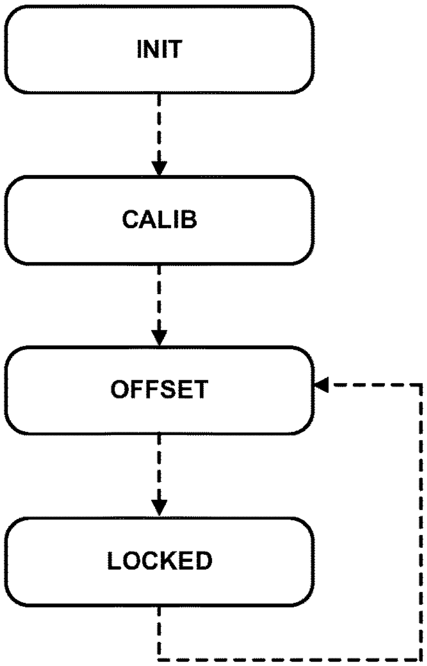
FIG. 7B is state machine flow chart which may be used with the feedback loop of FIG. 7A.

FIG. 7B provides an exemplary implementation of a drift compensation state machine process. For example, the INIT state waits for wireless data path initialization. Since no wireless ready signal is available in the audio subsystem, a short busy wait is used to transition out of this state. The CALIB state performs an open loop calibration of the Audio PLL. Compensation is calculated using drift errors by the wireless clock alone without any feedback from the audio subsystem. Once the center frequency is computed, the state machine transitions to the next state. The OFFSET state makes coarse but quick corrections to the audio clock. Once the detected error reaches a certain low threshold, the state machine transitions out of this state. The LOCKED state makes only fine corrections to the audio clock. If the detected error exceeds a certain large threshold, the state machine returns to the OFFSET state for coarse clock corrections.

Figure 8A:
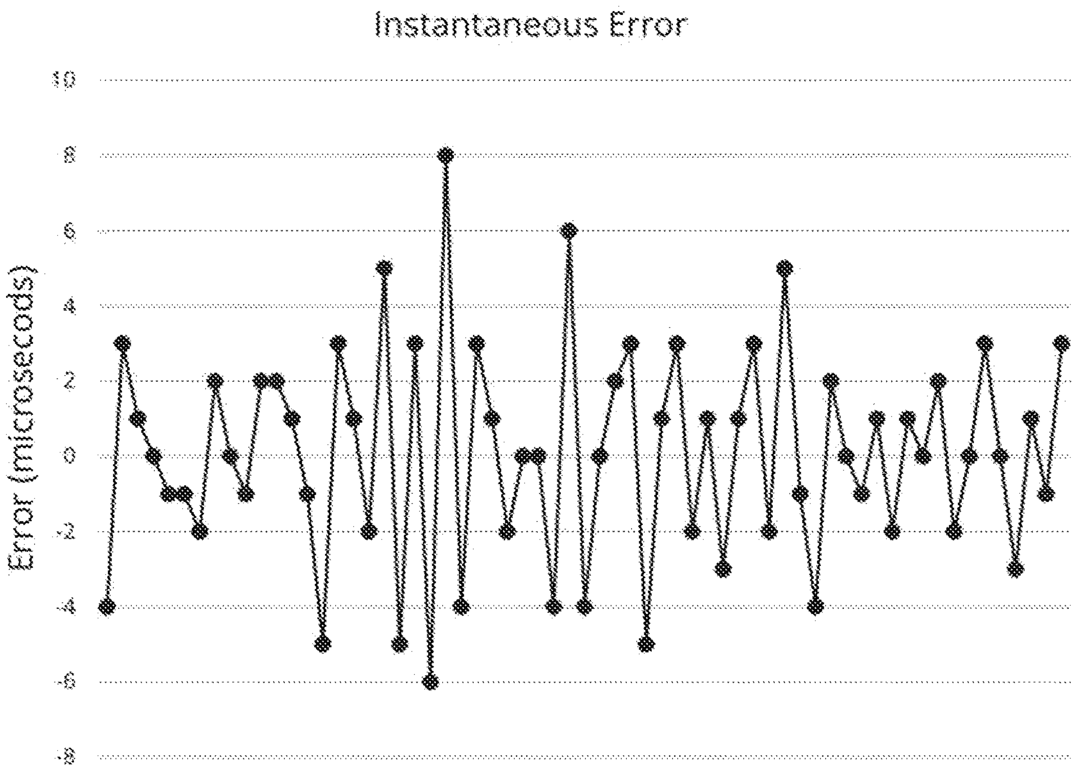
FIG. 8A illustrates instantaneous errors of a synchronization distribution unit (SDU) synchronization reference, in accordance with some example embodiments.
Figure 8B:
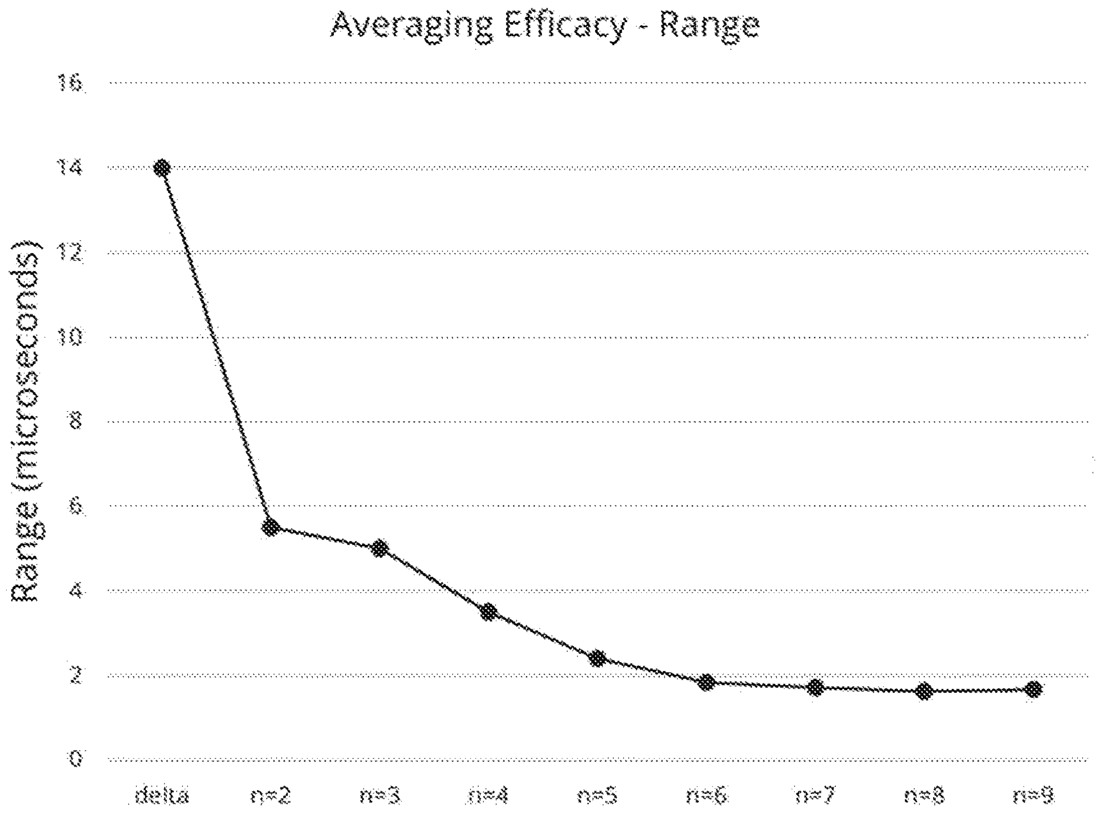
FIG. 8B illustrates efficacy of sample averaging, in accordance with some example embodiments.

In some implementations, averaging may be used to smooth out large swings of errors detected by adjacent samples. For example, in the sample set illustrated by FIG. 8A, the maximum delta between adjacent sampling of SDU Synchronization Reference is 14-µs. Large swings results in an overactive loss of lock in the state machine. Averaging the samples effectively narrows the error range as illustrated in FIG. 8B. Averaging just a few samples (N) can effectively eliminate large range of errors.

Presentation Compensation

Presentation Compensation computes the time and output path delay (or offset) to present rendered audio at the specified Presentation_Delay time. See, for example, FIG.

Figure 9A:
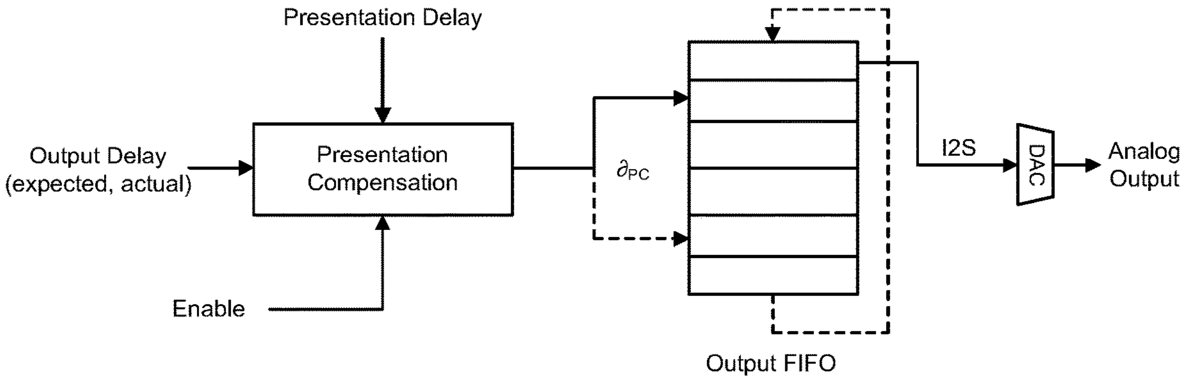
FIG. 9A illustrates a block diagram of an output audio path with Presentation Compensation, in accordance with some example embodiments.
Figure 9B:
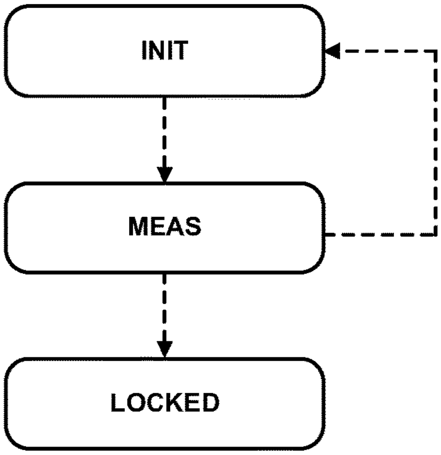
FIG. 9B is a flow chart of a presentation compensation state machine, in accordance with some example embodiments.

9A. The Presentation Compensation calculation is called with every received audio frame from the wireless subsystem. This variable is set by an upper layer protocol subsystem. Presentation Compensation behavior may also be driven by a state machine, as illustrated in FIG. 9B. This state machine is called regularly to compute the presentation delay (∂PC). The INIT state waits forwireless data path initialization. Since no wireless ready signal is available in the audio subsystem, a short busy wait is used to transition out of this state. The MEAS state will measure the expected presentation delay over a period of time. In this state, the average presentation delay is computed. If the value is stable, the error is below a low threshold, then the state machine transitions to the locked state. If the error does not fall below the low threshold, then the state machine resets by returning to the INIT state. The LOCKED state means the algorithm is idle. The presentation delay is a constant value and does not need adjustment once computed. The Drift Compensation state machine will transition this state machine back to the INIT state if it unlocks.

Presentation Compensation (∂PC) adjustments will delay audio samples up until the computed output delay. Delay is achieved by increasing the delta between the producer and consumer pointers in the Audio FIFO. Increasing the delta between the pointers effectively increases the output delay at the resolution of an audio block. Presentation Delay values expressed in the "Basic Audio Profile" specification are 40-ms. The Audio FIFO implementation uses audio block sizes evenly divisible by the audio frame size, for example, 1-ms or 1.25 ms. Adjustment in resolutions of 1-ms are possible with the current implementation.

The Audio FIFO is implemented as a circular buffer of audio blocks. Each audio block is index with a producer and consumer pointer. Audio block pointers increment at N+1 will wraparound to the beginning of the array. A single audio block is used to exchange data (input, output or both) with the I2S peripheral. The small audio block sizes allow for improved end-to-end latency.

The Audio FIFO is organized to always store stereo samples using signed 16-bit integers. The sampling rate is configured at runtime. This allows for efficient I2S data exchange with common stereo codecs, e.g., the Maxim MAX9867.

Due to the fixed organization of the Audio FIFO, various audio block manipulation routines are provided to format wireless audio data. Manipulation of the stereo samples occurs prior to encoding or after decoding of the audio frame. The manipulation is specific to the audio frame and may convert stereo to mono, mono to stereo, bit precision (e.g., 8, 16, 24, or 32 bit) or sample rate (e.g., 8, 16, 32, or 48 kHz.

Audio Input Processor

A timer ISR is used to process audio input JIT, for example as illustrated in FIG. 6. The timer is setup to expire such that there is enough time to (1) encode all audio frames (i.e., maximum encode time) for each stream (left, right or both), and (2) submit audio frames to the wireless within the ISO setup time. The audio input processing also ensures identical left and right Sample Start Reference are used to encode audio frames. When using a timer to implement the audio input processing, ensure the timer is synchronized with the source wireless clock, otherwise drift will occur.

Audio input processing is sensitive to maximum processing of frames. Preempting or delaying processing will result in missed audio servicing. This is not catastrophic but will result in audio artifacts. The audio input processing should use the highest thread or ISR priority when possible.

Common Time-Base for Multiple CPU Systems

In a multi-processor system, the Presentation Compensation calculations require a common clock reference between different CPUs. One of the CPUs uses this time-base for receive packet timestamps. A different CPU uses this time-base to timestamp I2S operation. One possible implementation on the nRF5340 is to use a DPPI to trigger a common start between the CPUs timer peripheral. These timers once running should not stop to remain synchronized.

Adjustments for fractional frame sizes, e.g., 7.5-ms are possible. Audio block size may be modified to 1.25-ms boundaries to divide evenly. The 1.25-ms will match all possible configurations of ISO intervals available to standard Bluetooth LE.

Various embodiments of implementing the above described wireless to output clock synchronization can be made. As described in detail above, an on-chip PLL can be used to adjust the output circuit clock by measuring the error between an off-chip I2S codec an on-chip wireless clock signal and then correcting by making adjustments with the on-chip PLL. Alternatively, an off-chip PLL that is part of the output codec may be used to adjust the output clock signal timing. Once again, by measuring the error between the off-chip I2S codec an on-chip wireless clock signal, corrections to the output clock signal can be made by making adjustments with the off-chip PLL. It will also be appreciated that in some situations it may be desirable to adjust the wireless clock signal timing instead of the output clock signal to achieve the desired synchronization between the wireless clock signals and the output clock signals. In this case, adjustments using the timer of the wireless clock can be made.

In addition, adjustments may be made to align the start of an output frame between multiple devices. These adjustments will vary from device to device to align the frame start timing with a common reference point.

Figure 10:
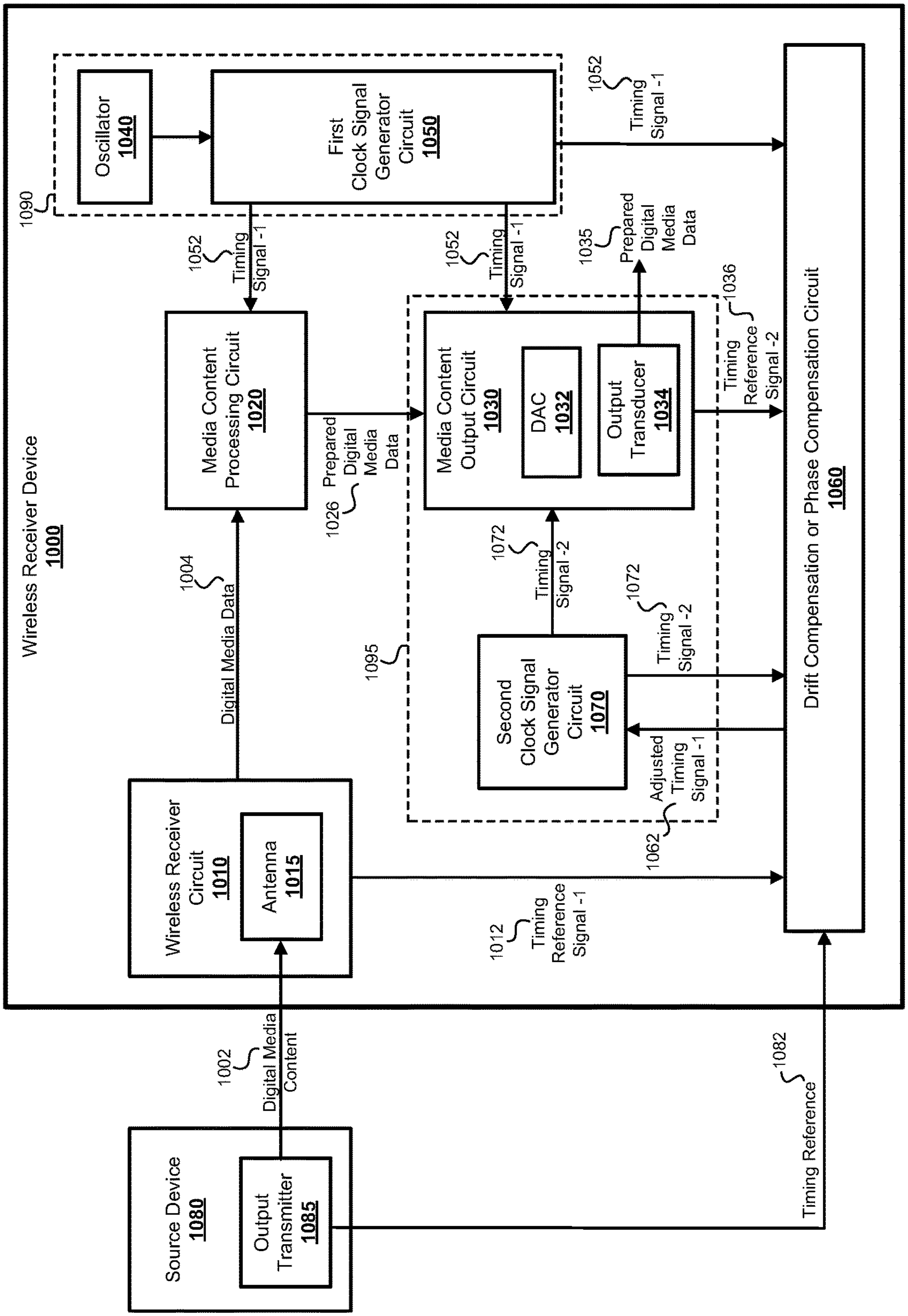
FIG. 10 is a block diagram of a wireless receiver device having a drift compensation system, in accordance with some example embodiments.

FIG. 10 is a block diagram of a wireless receiver device 1000 having a drift compensation and/or phase compensation system, in accordance with some example embodiments. While certain specific features are illustrated, those skilled in the art will appreciate from the present disclosure that various other features have not been illustrated for the sake of brevity, and so as not to obscure more pertinent aspects of the implementations disclosed herein.

In an exemplary embodiment, FIG. 10 illustrates a BLE protocol environment and BLE synchronization of audio and wireless clocks for the communications between a wireless receiver device 1000 and the source device 1080. In some implementations, there may be one source device 1080 and multiple wireless receiver devices 1000 (e.g., a pair of headphones, i.e., ear buds), where each wireless receiver device is configured to synchronize the clock signals based on the source input (e.g., an audio signal).

Additionally, or alternatively, in some implementations, the source device 1080 includes the same synchronization components described herein for the wireless receiver device 1000 for a drift compensation and/or phase compensation system (e.g., to synchronize received signals from one or more devices). For example, the source device 1080 (or another device) may be utilized for a microphone (or input) synchronization path, where the same synchronization methods described herein may be applied (e.g., in a reverse direction from the wireless receiver device 1000 to the source device 1080). For example, FIG. 1A speakers may be microphones and the "source" device may be a "receiver" device. Thus, the descriptions herein for synchronizing clock signals remain the same, but the direction of the audio path is different (e.g., wireless audio transmitters may be synchronized to a very high precision). For example, synchronizing multiple inputs from different microphones may reduce or eliminate background noise echo effects when using multiple microphones, and synchronizing multiple inputs from different microphone input signals may be useful for ambisonic sound capture (e.g., a full-sphere surround sound format), where capturing ambient sounds (especially directional sounds) with multiple microphones needs to be accurate.

In some implementations, the wireless receiver device 1000 includes a wireless receiver circuit 1010 that includes an antenna 1015 that receives digital media content 1002 from an output transmitter 1085 of a source device 1080. For example, a source device 1080 may be a media content transmitting device, and the wireless receiver device may be a device that wirelessly receives media content data and generates media content for playback for a user (e.g., BLE audio). In some implementations, the digital media content 1002 may include isochronous transports as specified for Bluetooth LE core specifications (e.g., Broadcast Isochronous Stream (BIS), Connected Isochronous Stream (CIS), etc.), or similar wireless technologies and associated communications protocols.

In some implementations, the wireless receiver device 1000 includes a media content processing circuit 1020 that receives digital media data 1004 from the wireless receiver circuit 1010. The media content processing circuit 1020 is configured to generated prepared digital media data 1026 from the received digital media data 1004. The media content processing circuit 1020 is also configured to receive a timing signal (e.g., timing signal −1 1052). In some implementations, the wireless receiver circuit 1010 may add timestamps to the received data packet and pass the timestamps along with the digital media data 1004. In some implementations, the digital media data 1004 may include isochronous interface packets as specified for Bluetooth LE core specifications (e.g., Bluetooth HCI ISO data packets, etc.), or similar wireless technologies and associated communications protocols.

In some implementations, the wireless receiver device 1000 includes a media content output circuit 1030 configured to receive the prepared digital media data 1026 and to output prepared digital media data 1035 with a defined timing (e.g., based on a timing signal).

In some implementations, the wireless receiver device 1000 includes an oscillator 1040. For example, oscillator 1040 is a clock generation source which generates a single output frequency. In some implementations, the wireless receiver device 1000 includes a first dock signal generator circuit 1050 coupled to an output of the oscillator 1040. The first clock signal generator circuit 1050, utilizing the output of the oscillator 1040, may be configured to generate first timing signals (e.g., timing signal −1 1052) for the media content processing circuit 1020 and the media content output circuit 1030.

In some implementations, the wireless receiver device 1000 includes a drift compensation or phase compensation circuit 1060 that is configured to compensate for clock drift according to embodiments described herein. As illustrated, the drift compensation or phase compensation circuit 1060 is coupled to the first clock signal generator circuit 1050 and configured to receive first timing signals (e.g., timing signal −1 1052). In some implementations, the drift compensation or phase compensation circuit 1060 is configured to adjust a phase and/or adjust a frequency of timing signals (e.g., timing signal −1 1052), and output adjusted timing signals (e.g., adjusted timing signal −1 1062). For example, the first clock signal may be slower than the second clock, and the second clock may adjust a clock signal by lowering the clock frequency until the speed matches the first clock signal.

In some implementations, the wireless receiver device 1000 includes a second clock signal generator circuit 1070. The second clock signal generator circuit 1070 may be configured to receive the adjusted first timing signals (e.g., adjusted timing signal −1 1062) from the drift compensation or phase compensation circuit 1060 and to output second timing signals (e.g., timing signal −2 1072) for clocking the media content output circuit 1030.

In some implementations, the drift compensation or phase compensation circuit 1060 is configured to compare the second timing signals to a timing reference 1082 received from the source output transmitter 1085 of the source device 1080 to determine whether there is a clock drift between the timing signals.

In some implementations, the media content output circuit 1030 includes a digital to analog converter (DAC) 1032 coupled to an output transducer 1034. In some implementations, the output transducer 1034 includes or is a speaker, and the prepared digital media content 1002 includes digitally encoded audio.

In some implementations, the drift compensation or phase compensation circuit 1060 is configured to receive a first timing reference signal (e.g., timing reference signal −1 1012) from the wireless receiver circuit 1010. In some implementations, the drift compensation or phase compensation circuit 1060 is configured to receive a second timing reference signal (e.g., timing reference signal −2 1036) from the media content output circuit 1030. In some implementations, the drift compensation or phase compensation circuit 1060 includes a feedback loop that compares the first timing reference signal (e.g., timing reference signal −1 1012) from the wireless receiver circuit 1010 to the second timing reference signal (e.g., timing reference signal −2 1036) from the media content output circuit 1030. For example, a comparison of the two timing reference signals may be utilized to determine whether there is a clock drift between the two signals (e.g., a frequency shift, a phase shift, a combination of the two, and the like).

In some implementations, the second clock signal generator circuit 1070 and the media content output circuit 1030 are on a different integrated circuit from the first clock signal generator circuit 1050. For example, as illustrated in FIG. 10, an integrated circuit 1090 includes the hardware oscillator 1040 and the first clock signal generator circuit 1050, and an integrated circuit 1095 includes the second clock signal generator circuit 1070 the media content output circuit 1030.

In some implementations, multiple wireless receiver devices (e.g., wireless receiver device 1000) may be synchronized to the same wireless transmitter device (e.g., source device 1080) that may include a timing offset. In some implementations, the timing offset of each wireless transmitter device may present the media content out of the output transducer 1034 at slightly different times amongst each of the multiple wireless receiver devices. For example, variations in the circuitry and software execution could result in a phase difference between the timing reference signal −2 1036 on each wireless receiver device of the multiple wireless receiver devices, even if each wireless receiver device are all listening to the same source (e.g., source device 1080).

In an exemplary implementation, where multiple wireless receiver devices are synchronized to the same wireless transmitter device, phase compensation may be used to remove any offset discovered by variations in circuitry and software execution amongst the plurality of wireless receiver devices. For example, a phase compensation circuit (e.g., drift compensation or phase compensation circuit 1060) may use a timestamp from a timing reference signal (e.g., timing reference signal −2 1036) and/or use a timestamp from the digital media content 1002. In some implementations, a wireless receiver device 1000 may adjust a time difference to a predefined value such that all wireless receiver devices may have the same offset. For example, adjusting the adjusted time signal 1062 faster or slower will adjust the phase of the media content output circuit 1030 such that the phase may be shifted until the phase aligns to the predefined value.

In some implementations, multiple sources (e.g., source device 1080) may be communicatively coupled with one wireless receiver device 1000. For example, multiple microphones devices may be connected to a single receiver that synchronizes each received audio signal (e.g., ambisonic audio).

Figure 11:
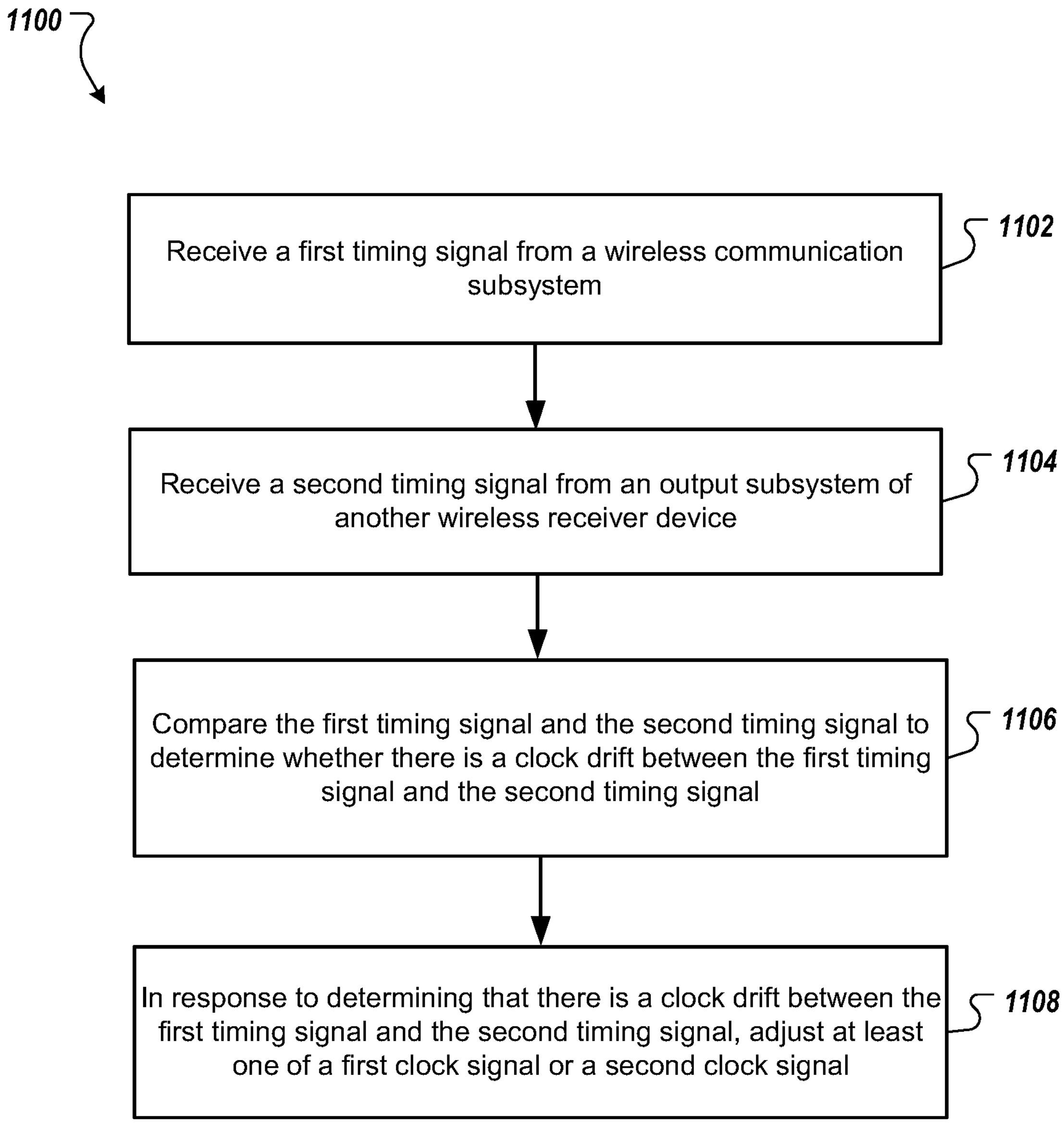
FIG. 11 is a flowchart representation of a method for providing customized feedback content during meditation based on physiological data in accordance with some implementations.

FIG. 11 is a flowchart illustrating an exemplary method 1100. In some implementations, a device such as wireless receiver device 1000 (FIG. 10) performs the techniques of method 1100 to adjust at least one clock signal of an output subsystem or a wireless communication subsystem in response to identifying a clock drift according to some implementations. In some implementations, the method 1100 is performed on processing logic, including hardware, firmware, software, or a combination thereof. In some implementations, the method 1100 is performed on a processor executing code stored in a non-transitory computer-readable medium (e.g., a memory).

At block 1102, the method 1100, at a first wireless receiver device including a processor, receives a first timing signal from a wireless communication subsystem of the first wireless receiver device. For example, the wireless receiver device 1000 receives timing signal −1 1052 from the first clock signal generator circuit 1050 (e.g., a wireless communication subsystem of the first wireless receiver device).

At block 1104, the method 1100 receives a second timing signal from an output subsystem of a second wireless receiver device that is different than the first wireless receiver device. For example, the wireless receiver device 1000 receives a timing reference 1082 from the source device 1080 (e.g., a second wireless receiver device that is different than the first wireless receiver device 1000).

At block 1106, the method 1100 compares the first timing signal and the second timing signal to determine whether there is a clock drift between the first timing signal and the second timing signal. For example, the wireless receiver device 1000 includes a drift compensation or phase compensation circuit 1060 that is configured to compare timing signals to determine whether there is a clock drift between the two signals.

At block 1108, the method 1100, in response to determining that there is a clock drift between the first timing signal and the second timing signal, adjusts at least one of a first clock signal associated with the wireless communication subsystem of the first wireless receiver device, or a second clock signal associated with the output subsystem of the second wireless receiver device. For example, the drift compensation or phase compensation circuit 1060 is configured to resynchronize two clock signals based on determining whether there is clock drift between two received clock signals.

In some implementations, adjusting the first clock signal or the second clock signal is based on adjusting the phase and/or adjusting the frequency of the first clock signal or the second clock signal. For example, the first clock signal is slower than the second clock, and the second clock adjusts by lowering the clock frequency until the speed matches the first clock signal.

Aspects of the novel systems, apparatuses, and methods are described more fully above with reference to the accompanying drawings. The teachings of the disclosure may, however, be embodied in many different forms and should not be construed as limited to any specific structure or function presented throughout this disclosure. Rather, these aspects are provided so that this disclosure will be thorough and complete, and will fully convey the scope of the disclosure to those skilled in the art. Based on the teachings herein one skilled in the art should appreciate that the scope of the disclosure is intended to cover any aspect of the novel systems, apparatuses, and methods disclosed herein, whether implemented independently of or combined with any other aspect of the disclosure. For example, a system or an apparatus may be implemented, or a method may be practiced using any one or more of the aspects set forth herein. In addition, the scope of the disclosure is intended to cover such a system, apparatus or method which is practiced using other structure, functionality, or structure and functionality in addition to or other than the various aspects of the disclosure set forth herein. It should be understood that any aspect disclosed herein may be set forth in one or more elements of a claim. Although some benefits and advantages of the preferred aspects are mentioned, the scope of the disclosure is not intended to be limited to particular benefits, uses, or objectives. The detailed description and drawings are merely illustrative of the disclosure rather than limiting, the scope of the disclosure being defined by the appended claims and equivalents thereof.

With respect to the use of plural vs. singular terms herein, those having skill in the art can translate from the plural to the singular and/or from the singular to the plural as is appropriate to the context and/or application. The various singular/plural permutations may be expressly set forth herein for sake of clarity.

When describing an absolute value of a characteristic or property of a thing or act described herein, the terms "substantial," "substantially," "essentially," "approximately," and/or other terms or phrases of degree may be used without the specific recitation of a numerical range. When applied to a characteristic or property of a thing or act described herein, these terms refer to a range of the characteristic or property that is consistent with providing a desired function associated with that characteristic or property.

In those cases where a single numerical value is given for a characteristic or property, it is intended to be interpreted as at least covering deviations of that value within one significant digit of the numerical value given.

If a numerical value or range of numerical values is provided to define a characteristic or property of a thing or act described herein, whether or not the value or range is qualified with a term of degree, a specific method of measuring the characteristic or property may be defined herein as well. In the event no specific method of measuring the characteristic or property is defined herein, and there are different generally accepted methods of measurement for the characteristic or property, then the measurement method should be interpreted as the method of measurement that would most likely be adopted by one of ordinary skill in the art given the description and context of the characteristic or property. In the further event there is more than one method of measurement that is equally likely to be adopted by one of ordinary skill in the art to measure the characteristic or property, the value or range of values should be interpreted as being met regardless of which method of measurement is chosen.

It will be understood by those within the art that terms used herein, and especially in the appended claims (e.g., bodies of the appended claims) are intended as "open" terms unless specifically indicated otherwise (e.g., the term "including" should be interpreted as "including but not limited to," the term "having" should be interpreted as "having at least," the term "includes" should be interpreted as "includes but is not limited to," etc.).

It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to embodiments containing only one such recitation, even when the same claim includes the introductory phrases "one or more" or "at least one" and indefinite articles such as "a" or "an" (e.g., "a" and/or "an" should typically be interpreted to mean "at least one" or "one or more"); the same holds true for the use of definite articles used to introduce claim recitations. In addition, even if a specific number of an introduced claim recitation is explicitly recited, those skilled in the art will recognize that such recitation should typically be interpreted to mean at least the recited number (e.g., the bare recitation of "two recitations," without other modifiers, typically means at least two recitations, or two or more recitations).

In those instances where a convention analogous to "at least one of A, B, and C" is used, such a construction would include systems that have A alone, B alone, C alone, A and B together without C, A and C together without B, B and C together without A, as well as A, B, and C together. It will be further understood by those within the art that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include A without B, B without A, as well as A and B together.

Various modifications to the implementations described in this disclosure can be readily apparent to those skilled in the art, and generic principles defined herein can be applied to other implementations without departing from the spirit or scope of this disclosure. Thus, the disclosure is not intended to be limited to the implementations shown herein but is to be accorded the widest scope consistent with the claims, the principles and the novel features disclosed herein. The word "exemplary" is used exclusively herein to mean "serving as an example, instance, or illustration." Any implementation described herein as "exemplary" is not necessarily to be construed as preferred or advantageous over other implementations.

Certain features that are described in this specification in the context of separate implementations also can be implemented in combination in a single implementation. Conversely, various features that are described in the context of a single implementation also can be implemented in multiple implementations separately or in any suitable sub-combination. Moreover, although features can be described above as acting in certain combinations and even initially claimed as such, one or more features from a claimed combination can in some cases be excised from the combination, and the claimed combination can be directed to a sub-combination or variation of a sub-combination.

Although the disclosure herein has been described with reference to particular embodiments, it is to be understood that these embodiments are merely illustrative of the principles and applications of the present disclosure. It is therefore to be understood that numerous modifications may be made to the illustrative embodiments and that other arrangements may be devised without departing from the spirit and scope of the present disclosure as defined by the appended claims.

What is claimed is:

1. A wireless receiver device comprising:

a wireless receiver circuit comprising an antenna configured to receive digital media content wirelessly from a source transmitter of a source device;

a media content processing circuit configured to receive digital media data from the wireless receiver circuit and prepare the received digital media data for output;

a media content output circuit configured to receive the prepared digital media data and to output the prepared digital media data with a defined timing;

an oscillator;

a first clock signal generator coupled to an output of the oscillator, the first clock signal generator configured to generate first timing signals for the media content processing circuit and the media content output circuit;

a clock compensation circuit coupled to the first clock signal generator, the clock compensation circuit configured to:

receive a timing reference from the source transmitter of the source device, receive the first timing signals from the first clock signal generator, adjust a phase and/or adjust a frequency of the first timing signals, and output adjusted first timing signals; and a second clock signal generator configured to receive the adjusted first timing signals from the clock compensation circuit and to output second timing signals for clocking the media content output circuit, wherein the clock compensation circuit is configured to compare the second timing signals to the timing reference received from the source transmitter of the source device.

2. The wireless receiver device of claim 1, wherein the media content output circuit comprises a digital to analog converter coupled to an output transducer.

3. The wireless receiver device of claim 2, wherein the output transducer comprises a speaker, and the digital media content comprises digitally encoded audio.

4. The wireless receiver device of claim 1, wherein the second clock signal generator and the media content output circuit are on a different integrated circuit from the first clock signal generator.

5. The wireless receiver device of claim 1, wherein the clock compensation circuit is configured to receive a first timing reference signal from the wireless receiver circuit.

6. The wireless receiver device of claim 5, wherein the clock compensation circuit is configured to receive a second timing reference signal from the media content output circuit.

7. The wireless receiver device of claim 6, wherein the clock compensation circuit comprises a feedback loop that compares the first timing reference signal from the wireless receiver circuit to the second timing reference signal from the media content output circuit.

8. The wireless receiver device of claim 1, wherein the clock compensation circuit comprises at least one of a drift compensation circuit or a phase compensation circuit.

9. The wireless receiver device of claim 1, wherein the wireless receiver device is a first wireless receiver device of a plurality of wireless receiver devices, and each wireless receiver device of the plurality of wireless receiver devices is coupled to the source transmitter of the source device and configured to receive the timing reference from the source device.

10. The wireless receiver device of claim 9, wherein each wireless receiver device of the plurality of wireless receiver devices are configured to:

determine an offset based on detecting a time difference between the timing reference from the source device and a timing signal from a corresponding clock signal generator at each wireless receiver device; and adjust the timing signal from the corresponding clock signal generator to a predetermined value based on the offset.

11. The wireless receiver device of claim 1, wherein the wireless receiver device and the source device are Bluetooth Low Energy (BLE) devices.

12. The wireless receiver device of claim 1, wherein the wireless receiver circuit is configured to receive the digital media content wirelessly from the source transmitter of the source device via a wireless low-power personal area network.

13. A method comprising:

receiving, using an antenna of a wireless receiver circuit, digital media content wirelessly from a source transmitter of a source device;

receiving, using a media content processing circuit, digital media data from the wireless receiver circuit;

preparing, using the media content processing circuit, the received digital media data for output;

receiving, using a media content output circuit, the prepared digital media data;

outputting, using the media content output circuit, the prepared digital media data with a defined timing;

generating, using a first clock signal generator coupled to an output of an oscillator, first timing signals for the media content processing circuit and the media content output circuit;

receiving, using a clock compensation circuit coupled to the first clock signal generator, a timing reference from the source transmitter of the source device;

receiving, using the clock compensation circuit coupled to the first clock signal generator, the first timing signals from the first clock signal generator;

adjusting, using the clock compensation circuit coupled to the first clock signal generator, a phase and/or adjust a frequency of the first timing signals;

outputting, using the clock compensation circuit coupled to the first clock signal generator, adjusted first timing signals;

receiving, using a second clock signal generator, the adjusted first timing signals from the clock compensation circuit;

outputting, using the second clock signal generator, second timing signals for clocking the media content output circuit; and comparing, using the clock compensation circuit, the second timing signals to the timing reference received from the source transmitter of the source device.

14. The method of claim 13, wherein the media content output circuit comprises a digital to analog converter coupled to an output transducer.

15. The method of claim 13, wherein the second clock signal generator and the media content output circuit are on a different integrated circuit from the first clock signal generator.

16. The method of claim 13, wherein the clock compensation circuit is configured to receive a first timing reference signal from the wireless receiver circuit.

17. The method of claim 13, wherein the clock compensation circuit comprises at least one of a drift compensation circuit or a phase compensation circuit.

18. The method of claim 13, wherein the method is performed by a first wireless receiver device of a plurality of wireless receiver devices, and each wireless receiver device of the plurality of wireless receiver devices is coupled to the source transmitter of the source device and configured to receive the timing reference from the source device.

19. The method of claim 18, wherein the first wireless receiver device and the source device are Bluetooth Low Energy (BLE) devices.

20. The method of claim 13, wherein the wireless receiver circuit is configured to receive the digital media content wirelessly from the source transmitter of the source device via a wireless low-power personal area network.

* * * * *